United States Patent [19]

Roloff

[11] Patent Number: 4,811,071
[45] Date of Patent: Mar. 7, 1989

[54] VERTICAL TRANSISTOR STRUCTURE

[75] Inventor: Herbert F. Roloff, Munich, Fed. Rep. of Germany

[73] Assignee: Siemens Aktiengesellschaft, Berlin and Munich, Fed. Rep. of Germany

[21] Appl. No.: 96,218

[22] Filed: Sep. 8, 1987

Related U.S. Application Data

[63] Continuation of Ser. No. 772,171, Sep. 3, 1985, abandoned.

[30] Foreign Application Priority Data

Sep. 6, 1984 [DE] Fed. Rep. of Germany ....... 3432815

[51] Int. Cl.$^4$ .............................................. H01L 29/72
[52] U.S. Cl. ......................................... 357/34; 357/44
[58] Field of Search .............................. 357/34, 44, 48

[56] References Cited

U.S. PATENT DOCUMENTS

| | | | |
|---|---|---|---|
| 3,595,713 | 7/1971 | de Brebisson et al. | 357/44 X |
| 3,595,715 | 7/1971 | Thiré et al. | 357/44 X |
| 3,622,842 | 11/1971 | Oberai | 357/34 |
| 4,038,680 | 7/1977 | Yagi et al. | 357/44 |
| 4,260,999 | 4/1981 | Yoshioka | 357/34 |

FOREIGN PATENT DOCUMENTS 1949327 4/1971 Fed. Rep. of Germany .
2085407 12/1971 France .
1539688 1/1979 United Kingdom .

OTHER PUBLICATIONS

IBM Technical Disclosure Bulletin, vol. 13, No. 5, Oct. 1970 "Epitaxial Base Transistor" by M. B. Vora.

Primary Examiner—Andrew J. James
Assistant Examiner—Sara W. Crane
Attorney, Agent, or Firm—Herbert L. Lerner; Laurence A. Greenberg

[57] ABSTRACT

Vertical transistor structure with an epitaxially applied layer of the second conduction type on a semiconductor substrate of the first conduction type, in which a tray is formed by insulating walls of the first conduction type extending into the semiconductor substrate. A first highly doped buried layer of the second conduction type in which a second buried layer of the first conduction type extending into the epitaxial layer of the first conduction type is embedded insulated from the semiconductor substrate. Three doped zones of which one, of the second conduction type, is provided for the base terminal and one of the first conduction type for the emitter and collector terminal, and a zone connecting the collector terminal zone and the second buried layer, of the first conduction type, where these regions form the collector. The emitter zone and the collector terminal zone are arranged above opposite end regions of the second buried layer.

1 Claim, 1 Drawing Sheet

VERTICAL TRANSISTOR STRUCTURE

This application is a continuation of application Ser. No. 772,171, filed Sept. 3, 1985, now abandoned.

BACKGROUND OF THE INVENTION

1. Field of the Invention

The invention relates to a vertical transistor structure in which an epitaxial layer is formed on the semiconductor substrate and a vertical transistor is formed in an epitaxial tray.

2. Description of the Prior Art

Such a transistor structure is called a vertical pnp-transistor. Among other things, vertical transistors have the advantage over lateral transistors in that the current does not flow at the surface and therefore, surface effects have only little influence on the transistor function. Lateral transistors require a relatively large base width due to their design, in which an emitter zone is surrounded by a collector ditch separated by the base region, because of undesired underetching and widening of fusion zones. Connected therewith is a higher gain factor only for small currents, while for larger currents, the gain decreases greatly. Vertical transistors, on the other hand, have a smaller base width and a high current gain which is less current dependent, as well as a current carrying capacity layer by about two orders of magnitude.

According to the state of the art, a vertical pnp-transistor is formed in an epitaxial tray on the semiconductor substrate which is insulated from other regions of the semiconductor crystal by insulating walls. In the interior between the insulating walls there are two buried layers, of which the first, n-doped one forms against the semiconductor substrate an insulating tray for the second p-doped buried layer which extends from the first buried layer into the epitaxial layer. Approximately centrally above the second buried layer there is a p-doped connecting zone which forms the emitter. The emitter connection zone surrounds a likewise p-doped ditch which extends down into the second buried layer and serves together with it as a collector which has a connecting zone in the region of the ditch. An n-doped base connection zone is arranged between the emitter connection zone and the collector ditch.

A vertical pnp-transistor constructed in this manner needs comparatively much larger space compared to npn-transistors, because within the tray formed by insulating walls, a collector ditch exists which surrounds the emitter connection zone.

SUMMARY OF THE INVENTION

It is an object of the invention to provide a structure of a vertical pnp-transistor which requires little space.

With the foregoing and other objects in view, there is provided in accordance with the invention, a vertical transistor structure comprising a semiconductor substrate of the first conductivity type, an epitaxially applied layer of the second conductivity type on the semiconductor substrate in which a tray is formed by insulating walls of the first conductivity type extending into the semiconductor substrate, a first highly doped buried layer of the second conductivity type in which a second buried layer of the first conductivity type extending into the epitaxial layer of the first conductivity type is embedded insulated from the semiconductor substrate, three doped zones of which one doped zone, of the second conductivity type, is provided for the base terminal and two doped zones of the first conduction type for the emitter and the collector terminal respectively, and a zone connecting the collector terminal zone and the second buried layer, of the first conduction type, where these regions form the collector, the combination thereof in which the emitter terminal zone and the collector terminal zone are arranged above opposite end regions of the second buried layer.

Transistor structure as above, characterized by the feature that the base terminal zone is arranged on the side of the emitter terminal zone facing away from the collector terminal zone.

Transistor structure as above, characterized by the feature that the three terminal zones (base, emitter and collector) are arranged in a row.

Other features which are considered as characteristic for the invention are set forth in the appended claims.

Although the invention is illustrated and described herein as embodied in vertical transistor structure, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawing, in which.

DESCRIPTION OF THE PREFERRED EMBODIMENT

Figure 1:
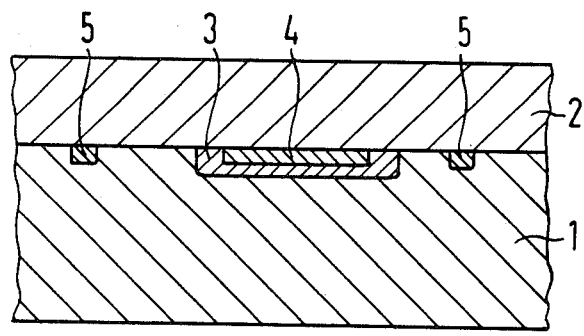
FIG. 1 diagrammatically illustrates a cross section through a semiconductor arrangement after the application of an epitaxial layer.

The invention will be explained in the following in greater details, making reference to three sections through semiconductor structures shown in the figures of the drawing, which are obtained in the manufacture of a transistor structure according to the invention which should be considered as an embodiment example. Similar elements are provided with the same reference symbols.

It is the basic idea of the invention to reduce the area required by the vertical pnp-transistor by providing that the emitter terminal zone is no longer completely surrounded by a collector ditch. It is advantageous here to relocate the base contact zone to the side of the emitter terminal zone on the side facing away from the collector terminal zone. If the transistor structure is part of an integrated circuit, it is advantageous to provide insulating walls as narrow as possible when obtaining a tray in which the transistor is formed.

In manufacturing a transistor with a structure according to the invention, doped zones 3 to 5 are first generated according to FIG. 1 in a semiconductor substrate 1 of the p-conduction type before an epitaxial layer 2 is applied. An $n^+$-doped zone 3 generated as the first doped zone forms vis-a-vis the semiconductor substrate 1, an insulating tray for a $p^+$-doped zone 4 embedded therein. In the same process step as zone 4, a ditch 5 is likewise doped with p+-conduction. Ditch 5 is spaced from and surrounds zone 3. The known techniques can be used for preparing the doped zones 3 to 5; preferably, however, the dopings are implanted in order to obtain primarily zones 3 and 4 as homogeneous as possible. Furthermore, zone 3 must completely surround zone 4 laterally in order to assure insulation of zone 4 from the substrate and must extend deeper and wider than the latter into the semiconductor substrate 1. After performing the dopings in this manner, the epitaxial layer 2 covering the semiconductor substrate 1 and the zones 3 to 5 with n-or n−-conduction is applied. For greater clarity, a thermally caused outgrowth of the zones 3 to 5 beginning with the application of the epitaxial layer 2, particularly into the epitaxial layer 2 itself, is not sketched. Zones 3 and 4 are also referred to in the following as the first (3) buried layer and second (4) buried layer.

In further process steps, a corresponding p++-doped ditch is formed in the epitaxial layer 2 above the p+-doped ditch 5 enclosing the first buried layer 3 and covered by the epitaxial layer 2; and also a p++-doped saucer 9 is formed above the end region of the second buried layer 4. The fabrication is again carried out by techniques known per se, preferably by diffusion, although implantation may also be employed.

Figure 2:
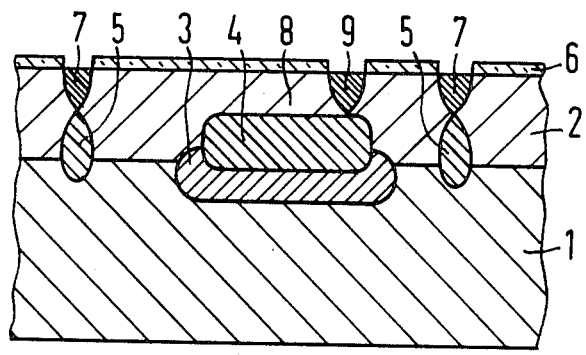
FIG. 2 shows a section through a semiconductor arrangement prior to the doping of the connecting zones.

FIG. 2 shows a section through a semiconductor arrangement prior to the doping of the connecting zones for a transistor structure according to the invention which is to be fabricated according to the embodiment example.

The doping of the p++-conduction zones in the epitaxial layer 2 by diffusion and a temperature treatment of the semiconductor arrangement connected therewith preceded the fabrication. Sketched in FIG. 2 is the SiO$_2$-layer 6 covering the epitaxial layer 2 with the windows etched for the diffusion.

The temperature treatment causes the diffusion of foreign atoms from the doping substance into the epitaxial layer 2 and an outgrowth of the doped zones 3 to 5 generated in the preceding fabrication steps into regions with lower doping concentration. Here, the p+-doped ditch 5 and the corresponding p++-doped ditch 7 grow into the epitaxial layer 2 so deeply that they penetrate each other and a continuous p+ or p++ respectively, doped insulating wall 5+6 is generated. This wall 5+7 separates a tray 8, in which the transistor is formed, from the other regions of the epitaxial layer 2. In view of the objective to provide a transistor structure which requires as little space as possible, it is advantageous particularly for integrated circuits to generated the insulating wall 5+7 by the thermally caused growing toward each other i.e. each of the two doped zones 5 and 7 generated by itself and extended into layer 2 to meet. In this manner the insulating wall turns out narrower than with a single doping and subsequent temperature treatment of a zone in the semiconductor substrate 1 or in the epitaxial layer 2.

Likewise, with the same temperature treatment belonging to the mentioned diffusion process, the two buried layers 3 and 4 each continue to grow, particularly into the epitaxial layer 2. At the same time, the p++-doped saucer diffuses from the surface of the epitaxial layer 2 into the epitaxial layer 2 and toward the second buried layer 4 to an extent that the latter and the channel 9 generated from the p++-doped saucer penetrate each other. To enable the transistor structure to be generated, it is necessary that the second buried layer 4 grow faster into the epitaxial layer 2 than the first buried layer 3 which insulates it from the substrate. The different diffusion coefficients of the two doping substances are responsible for the faster outgrowth of the buried layer 4, for instance arsenic for the n+-doping of the first buried layer 3 and boron for the p+-doping of the second buried layer 4 will accomplish this result.

Figure 3:
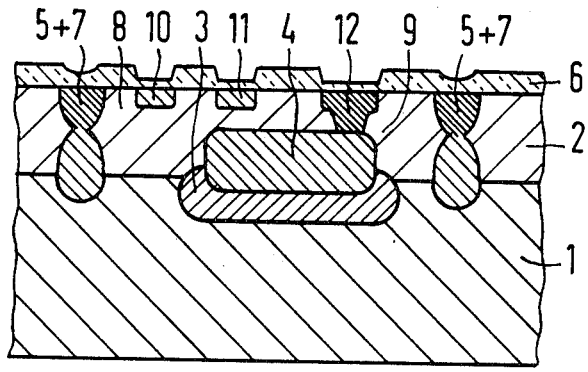
FIG. 3 is a cross section through a vertical pnp-transistor according to the invention before the metallic terminal contacts are applied.

FIG. 3 shows a cross section through a vertical pnp-transistor fabricated according to this embodiment example, after the base diffusion was made and the metallic contacts were applied. The connecting zones for the metal contacts are made by the base diffusion known per se, where the base terminal zone 10 n+ and the emitter zone 11 as well as the collector contact zone 12 each have p+-doping. The doped zones already existing in FIG. 2 grow deeper and wider into the semiconductor substrate 1 and/or the epitaxial layer 2 due to the temperature treatments of the semiconductor arrangement connected with the base diffusion. An SiO$_2$-layer 6 is formed.

The p+-doped collector terminal zone 12 together with the p++-doped channel 9 and the p+- dope buried layer 4 form the collector. The likewise p+-doped emitter zone 11 is located above the end region of the second buried layer 4 opposite the collector terminal zone 12. Since the collector terminal zone 12 and the channel 9 leading to the second buried layer 4 are arranged only on one side of the emitter terminal zone 11 and the channel 9 of this emitter terminal zone does not surround this emitter terminal zone as is customary according to the state of the art, in the form of a ditch, considerable overall length can be saved for the structure, according to the invention and as shown in FIG. 3, of a vertical pnp-transistor as shown, for instance in the plane of the drawing of the figures. Also the overall width which is thought as perpendicular to the plane of the drawing of the figures can be reduced considerably by such a transistor structure.

The n+-doped base terminal zone 10 can be located between the emitter zone 11 and the collector terminal zone 12 as corresponds to the vertical pnp-transistor according to the state of the art. Since usually, the distance between the base and the collector terminal zone is chosen larger than the distance between the base and the emitter terminal zone, it is advantageous to locate the base terminal zone 10 to the side of the emitter terminal zone 11 facing away from the collector terminal 12. It is furthermore advantageous to arranged the three terminal zones 10, 11 and 12 in a row.

Absolute dimensional data for the distances of the terminal zones 10 to 12 from each other as well as from the insulating wall 5+7 are difficult to state because they depend on the values for the electric field strength which depend on the supply voltages; however, they are roughly about 10 μm. Overall, an area is required for the vertical pnp-transistor according to the invention which is about half as large as in a vertical lateral pnp-transistor according to the state of the art and approximately the same size as in an npn-transistor.

Taking into account the permissible field strength values, the emitter zone 11 and the collector terminal zone 12 can lie relatively close together since the base terminal zone 10 does not lie between the emitter terminal zone 11 and the collector terminal zone 12. The space in the epitaxial layer 2 between the emitter zone 11 and the second buried layer 4 indicates the base width proper which can be adjusted to about 3 μm.

In the vertical pnp-transistor according to the invention, the disadvantages known from the lateral pnp-transistors with respect to current gain are eliminated; at the same time it has the advantages of a current carrying capacity approximately two orders of magnitude higher. With regard to the speed determined by the internal capacities and the applicable path resistances, the vertical pnp-transistor according to the invention is slightly worse than a vertical pnp-transistor according to the state of the art, but is considerably faster than a lateral pnp-transistor.

There is claimed:

1. Vertical transistor structure comprising a semiconductor substrate of the first conductivity type, a single epitaxially applied layer of the second conductivity type on said semiconductor substrate in which a tray is formed by insulating walls of the first conductivity type extending into the semiconductor substrate, a first highly doped buried layer of the second conductivity type in which a second buried layer of the first conductivity type extending into said epitaxial layer of the second conductivity type is embedded insulated from said semiconductor substrate, three doped zones of which one doped zone of the second conductivity type is provided for the base terminal and two doped zones of the first conductivity type for the emitter and the collector terminal respectively, said epitaxial layer surrounding said base and said emitter zones and serving as a base zone, and a zone connecting said collector terminal zone and said second buried layer of the first conductivity type, where the doped zone of the first conductivity type for the collector terminal and the zone connecting said collector terminal zone and said second buried layer of the first conductivity type, and said second buried layer form the collector, the combination thereof in which said emitter terminal zone and said collector terminal zone are arranged above opposite end regions of said second buried layer, said base terminal zone is arranged only on the side of said emitter terminal zone facing away from said collector terminal zone and said three terminal zones of the base, emitter and collector are arranged in a row.

* * * * *